(12) United States Patent
Lin et al.

(10) Patent No.: US 11,837,287 B2
(45) Date of Patent: *Dec. 5, 2023

(54) MEMORY SENSE AMPLIFIER WITH PRECHARGE

(71) Applicant: Taiwan Semiconductor Manufacturing Company, Ltd., Hsinchu (TW)

(72) Inventors: Zheng-Jun Lin, Taichung (TW); Chung-Cheng Chou, Hsinchu (TW); Pei-Ling Tseng, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/825,566

(22) Filed: May 26, 2022

(65) Prior Publication Data

US 2022/0359008 A1    Nov. 10, 2022

Related U.S. Application Data

(63) Continuation of application No. 17/000,980, filed on Aug. 24, 2020, now Pat. No. 11,348,638, which is a
(Continued)

(51) Int. Cl.
*G11C 13/00* (2006.01)
*G11C 7/06* (2006.01)
(Continued)

(52) U.S. Cl.
CPC ............ *G11C 13/004* (2013.01); *G11C 7/065* (2013.01); *G11C 7/08* (2013.01); *G11C 7/12* (2013.01); *G11C 2013/0042* (2013.01)

(58) Field of Classification Search
CPC .......... G11C 13/004; G11C 2013/0054; G11C 2013/0042; G11C 2013/0045;
(Continued)

(56) References Cited

U.S. PATENT DOCUMENTS

| 6,191,978 | B1 | 2/2001 | Watanabe et al. |
| 7,394,685 | B2 | 7/2008 | Ooishi et al. |

(Continued)

FOREIGN PATENT DOCUMENTS

| CN | 1953096 A | 4/2007 |
| CN | 102714053 A | 10/2012 |

(Continued)

*Primary Examiner* — Thong Q Le
(74) *Attorney, Agent, or Firm* — MERCHANT & GOULD P.C.

(57) ABSTRACT

A memory device includes a memory cell and a sense amplifier. The sense amplifier has a reference circuit configured to output a reference voltage and a sensing circuit connected to the memory cell. A comparator includes a first input and a second input, with the first input connected to the reference circuit to receive the reference voltage, and the second input connected to the memory cell. A precharger is configured to selectively precharge the sensing circuit to a predetermined precharge voltage.

20 Claims, 6 Drawing Sheets

Related U.S. Application Data continuation of application No. 16/273,608, filed on Feb. 12, 2019, now Pat. No. 10,755,780.

(60) Provisional application No. 62/644,021, filed on Mar. 16, 2018.

(51) Int. Cl.
*G11C 7/08* (2006.01)
*G11C 7/12* (2006.01)

(58) Field of Classification Search
CPC .......... G11C 7/062; G11C 7/065; G11C 7/08; G11C 7/12; G11C 13/0026; G11C 2213/79; G11C 11/1675; G11C 11/405; G11C 11/4076; G11C 11/5607; G11C 15/02; G11C 15/046; G11C 2211/4016; G11C 8/04; G11C 8/12; G11C 16/30; G11C 7/06; G11C 13/0004; G11C 13/0038; G11C 2213/82; G11C 7/067; G11C 7/14; G11C 11/5685; G11C 13/0028; G11C 13/0064; G11C 13/0069; G11C 2013/0066; G11C 2013/0076; G11C 2013/009; G11C 2013/0092; G11C 2213/15; G11C 2213/77; G11C 13/0097; G11C 5/147; G11C 7/18; G11C 8/14; H01L 27/0207; H01L 27/1203; H10N 70/011

USPC .......... 365/189.011, 230.03, 185.12, 189.15, 365/210.1, 185.11, 185.16, 185.17, 365/185.23, 185.25, 189.16, 72

See application file for complete search history.

(56) References Cited

U.S. PATENT DOCUMENTS

| | | | |
|---|---|---|---|
| 8,208,291 B2 | 6/2012 | Kim et al. | |
| 8,619,459 B1 | 12/2013 | Nguyen et al. | |
| 9,576,652 B1 | 2/2017 | Lim et al. | |
| 9,892,783 B2 | 2/2018 | Yoshimoto et al. | |
| 10,176,878 B2 | 1/2019 | Ihm et al. | |
| 10,755,780 B2* | 8/2020 | Lin | G11C 13/004 |
| 11,348,638 B2 | 5/2022 | Lin et al. | |
| 2011/0199812 A1 | 8/2011 | Kitagawa et al. | |
| 2014/0016404 A1 | 1/2014 | Kim et al. | |
| 2015/0364178 A1 | 12/2015 | Kim et al. | |
| 2017/0309330 A1 | 10/2017 | Pyo | |
| 2019/0088317 A1* | 3/2019 | Roy | G11C 11/1673 |

FOREIGN PATENT DOCUMENTS

| | | |
|---|---|---|
| CN | 106960685 A | 7/2017 |
| KR | 10-2011-0094240 A | 8/2011 |
| KR | 10-2017-0120446 A | 10/2017 |
| TW | 514924 B | 12/2002 |
| TW | 201403597 A | 1/2014 |

\* cited by examiner

MEMORY SENSE AMPLIFIER WITH PRECHARGE

CROSS REFERENCE

This application is a continuation of U.S. patent application Ser. No. 17/000,980, filed on Aug. 24, 2020, now U.S. Pat. No. 11,348,638, which is a continuation of U.S. patent application Ser. No. 16/273,608, filed on Feb. 12, 2019, now U.S. Pat. No. 10,755,780, which claims the benefit of U.S. Provisional Patent Application No. 62/644,021, filed on Mar. 16, 2018, the disclosures of which are incorporated by reference in their entireties.

BACKGROUND

Memory devices are used to store information in semiconductor devices and systems. Resistive Random Access Memory (RRAM) cells are non-volatile memory cells that store information based on changes in electric resistance. In general, an RRAM cell includes a storage node in which a bottom electrode, a resistive switching layer and a top electrode may be sequentially stacked. The resistance of the resistive switching layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
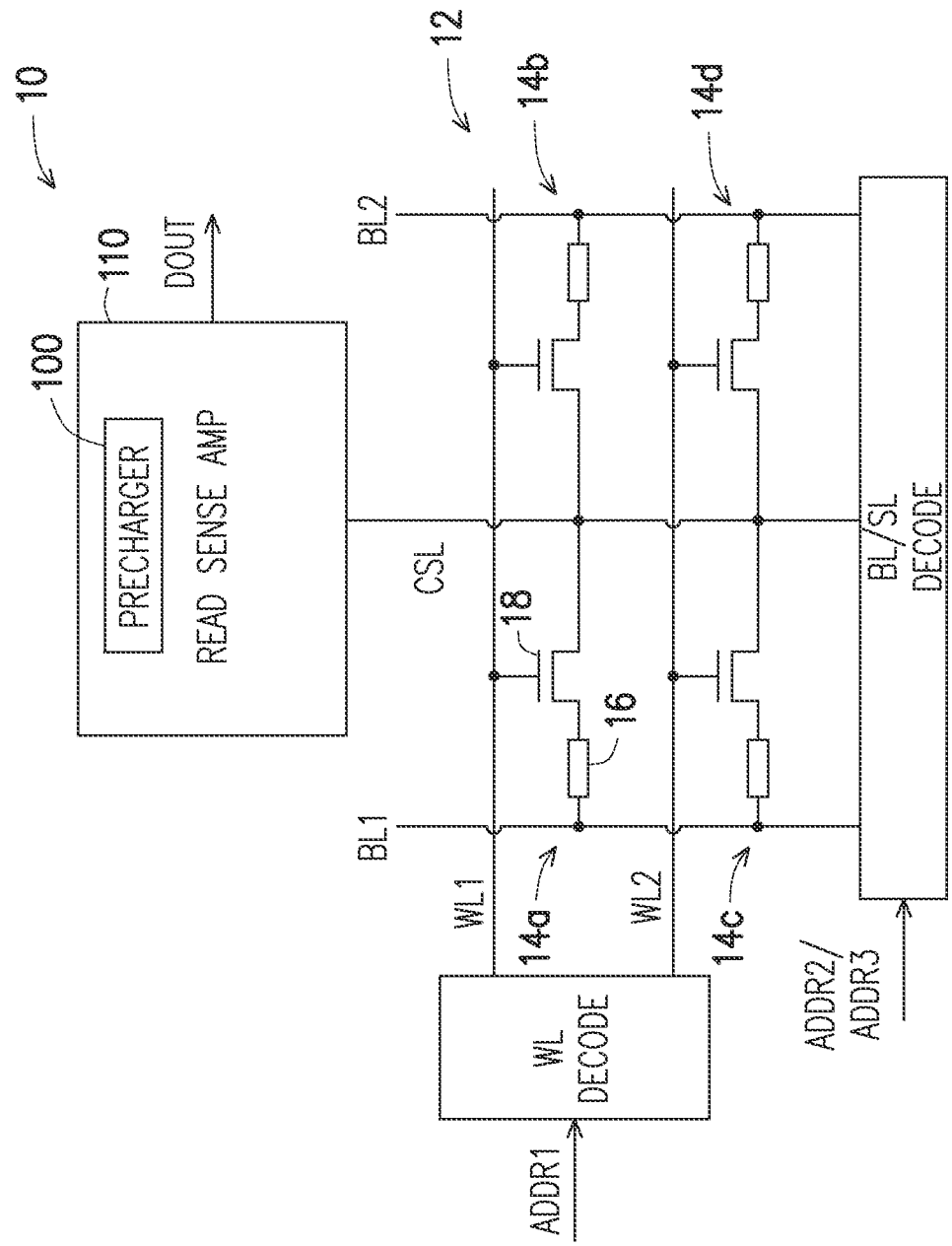
FIG. 1 is a block diagram depicting an example of an RRAM device with a precharger in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some disclosed embodiments concern a sense amplifier precharge system for a memory device. In some examples the memory device is a resistive random access memory (RRAM) device, though in other implementations other memory technologies may be employed. RRAM devices generally comprise a layer of high-k dielectric material arranged between conductive electrodes disposed within a back-end-of-the-line (BEOL) metallization stack. RRAM devices are configured to operate based upon a process of reversible switching between resistive states. This reversible switching is enabled by selectively forming a conductive filament through the layer of high-k dielectric material. For example, the layer of high-k dielectric material, which is normally insulating, can be made to conduct by applying a voltage across the conductive electrodes to form a conductive filament extending through the layer of high-k dielectric material. An RRAM cell having a first (e.g., high) resistive state corresponds to a first data value (e.g., a logical '0') and an RRAM cell having a second (e.g., low) resistive state corresponds to a second data value (e.g., a logical '1').

FIG. 1 illustrates an example of a memory circuit 10 in accordance with aspects of the present disclosure. In the illustrated example, the memory circuit may be an RRAM circuit 10 that includes an RRAM array 12 having a plurality of RRAM cells 14a-14d. For simplicity, only the RRAM cells 14a-14d are shown in FIG. 1; a typical RRAM memory array would include many more RRAM cells. The RRAM cells 14a-14d are arranged within the RRAM array 12 in rows and/or columns. RRAM cells 14a-14b or 14c-14d within a row of the RRAM array 12 are operably coupled to a word line WL1 or WL2, respectively, while RRAM cells 14a-14c or 14b-14d within a column of the RRAM array 12 are operably coupled to a bit line BL1 or BL2 and a common source line CSL. The plurality of RRAM cells 14a-14d are respectively associated with an address defined by an intersection of a word line WL1 or WL2 and a bit line BL1 or BL2.

Each of the RRAM cells 14a-14d includes an RRAM resistive element 16 and an access transistor 18. The RRAM resistive element 16 has a resistive state that is switchable between a low resistive state and a high resistive state. The resistive states are indicative of a data value (e.g., a "1" or "0") stored within the RRAM resistive element 16. The RRAM resistive element 16 has a first terminal coupled to one of the bit lines BL1 or BL2 and a second terminal coupled to the access transistor 18. The access transistor 18 has a gate coupled to one of the word lines WL1 or WL2, a source coupled to the common source line CSL and a drain coupled to the second terminal of the RRAM resistive element 16. By activating the word line WL1 or WL2, the access transistor 18 is turned on, allowing for the common source line CSL to be coupled to the second terminal of the RRAM resistive element 16.

The RRAM array 12 is configured to read data from and/or write data to the plurality of RRAM cells 14a-14d. A word line signal (e.g., a current and/or voltage) is applied to one of the word lines WL1-WL2 based upon a first address ADDR1 received by a word line decoder 20, a bit line signal is applied to one of the plurality of bit lines BL1-BL2 based upon a second address ADDR2 received by a bit line decoder 22. In some examples, a common source line signal is applied to the common source line CSL based on the second address ADDR2, and in other examples the CSL signal is applied to the common source line CSL based upon a third address ADDR3.

By selectively applying signals to the word lines WL1-WL2, the bit lines BL1-BL2, and the common source line CSL, forming, set, reset, and read operations may be performed on selected ones of the plurality of RRAM cells 14a-14d. For example, to read data from RRAM cell 14a, a word line signal (e.g., voltage) is applied to the word line WL1, a bit line signal (e.g., voltage) is applied to the bit line BL1, and a source line signal (e.g., voltage) is applied to the common source line CSL. The applied signals cause a read sense amplifier 110 to receive a signal (e.g., voltage) having a value that is dependent upon a data state of the RRAM cell 14a. The sense amplifier 110 is configured to sense this signal and to determine the data state of the selected RRAM cell 14a based on the signal (e.g., by comparing a received voltage to a reference voltage). In the illustrated embodiment, the sense amplifier 110 further includes a source line precharger 100 configured to precharge the common source line CSL prior to a read operation as discussed further below.

With increasing memory array sizes, long bit lines may be necessary. Due to such long bit lines, an RC delay can develop, in turn limiting memory access time. In accordance with aspects of the present disclosure, precharging the RRAM circuitry provides for faster memory access times, even as memory cell array sizes increase. Disclosed examples thus provide a precharger for an RRAM sense amplifier that precharges a sense amplifier input to a precharge value that is close to the memory read value, increasing access time. More particularly, in some embodiments, the sense amplifier includes a precharger that precharges the data read signal to nearly the reference voltage level. This results in a faster read, reducing cell access time by facilitating a faster development of the read signal and a wider swing from the reference voltage level.

Figure 2:
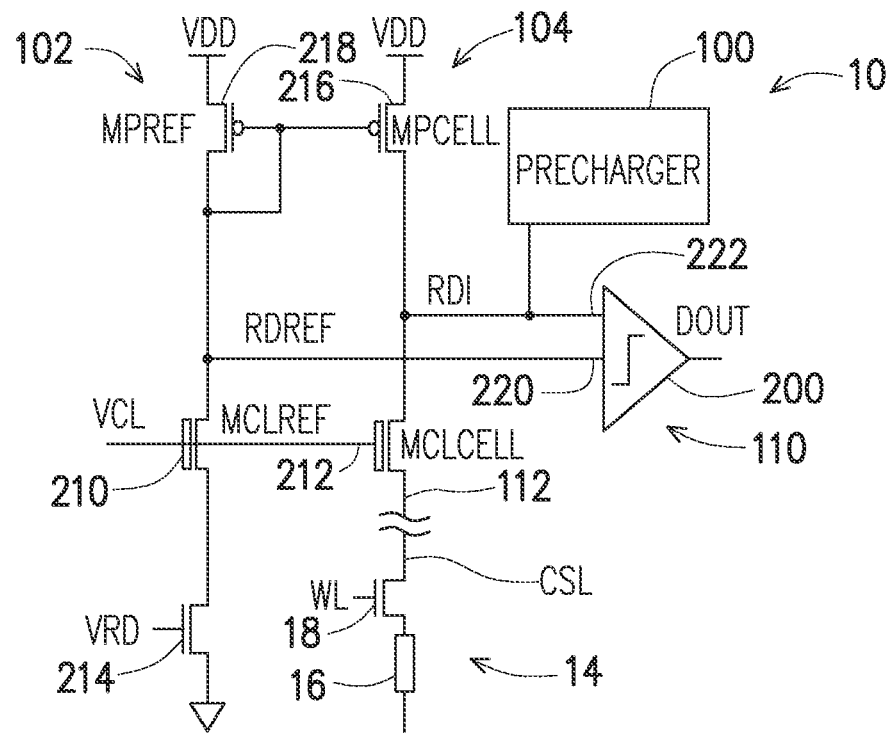
FIG. 2 is a circuit diagram depicting further aspects of the RRAM device shown in FIG. 1 in accordance with some embodiments.

FIG. 2 depicts a block diagram showing an example of the sense amplifier 110 of the RRAM device 10 shown in FIG. 1. The sense amplifier 110 includes a reference circuit 102 and a sensing circuit 104. The reference circuit 102 is configured to generate a reference voltage RDREF that is received at a first input 220 of a comparator 200. The reference circuit 102 includes a PMOS mirror transistor 218 with its source terminal coupled to a source voltage supply VDD. The mirror transistor 218 of the reference circuit 102 is diode-connected, with its gate coupled to its drain. The drain terminal of the mirror transistor 218 is further coupled to provide the reference voltage RDREF to the first input 220 of the comparator 200, and is also coupled to the source of an NMOS reference control transistor 210. The control transistor 210 has its gate coupled to receive a control voltage VCL and its drain coupled a second voltage terminal (ground) via an NMOS transistor 214, which receives a VRD signal at its gate.

The sensing circuit 104 includes a sense amplifier input terminal 112 that is selectively connected to the RRAM array 12 via the common source line CSL to selectively couple one of the RRAM cells 14 to the sense amplifier 110 in response to a word line signal WL received by the access transistor 18 of the memory cell 14. The sensing circuit 104 also includes a PMOS mirror transistor 216 with its source terminal coupled to the VDD terminal. The drain terminal of the mirror transistor 216 is coupled to provide a read signal RDI to a second input 222 of the comparator 200, and is further coupled to the source of an NMOS sensing control transistor 212. The sensing control transistor 212 has its gate coupled to receive the control voltage VCL and its drain coupled the RRAM cell 14 in response to a word line signal WL.

When the memory cell 14 is accessed for a read operation, the reference circuit 104 develops the reference signal RDREF at the first input 220 of the comparator 200, and the sensing circuit 104 is configured to generate the cell voltage RDI at the second input 222 of the comparator 200. The voltage difference between the first input 220 and the second input 222 determines the output DOUT of the sense amplifier 200. For example, in some embodiments, if RDREF is less than RDI, a voltage value corresponding to a logic "1" is output at DOUT, and if RDREF is greater than RDI, a voltage value corresponding to a logic "0" is output at DOUT.

The precharger 100 is configured to selectively precharge the sensing circuit 104 to a predetermined precharge voltage. In some examples, the precharge voltage is less than the source voltage VDD.

Figure 3:
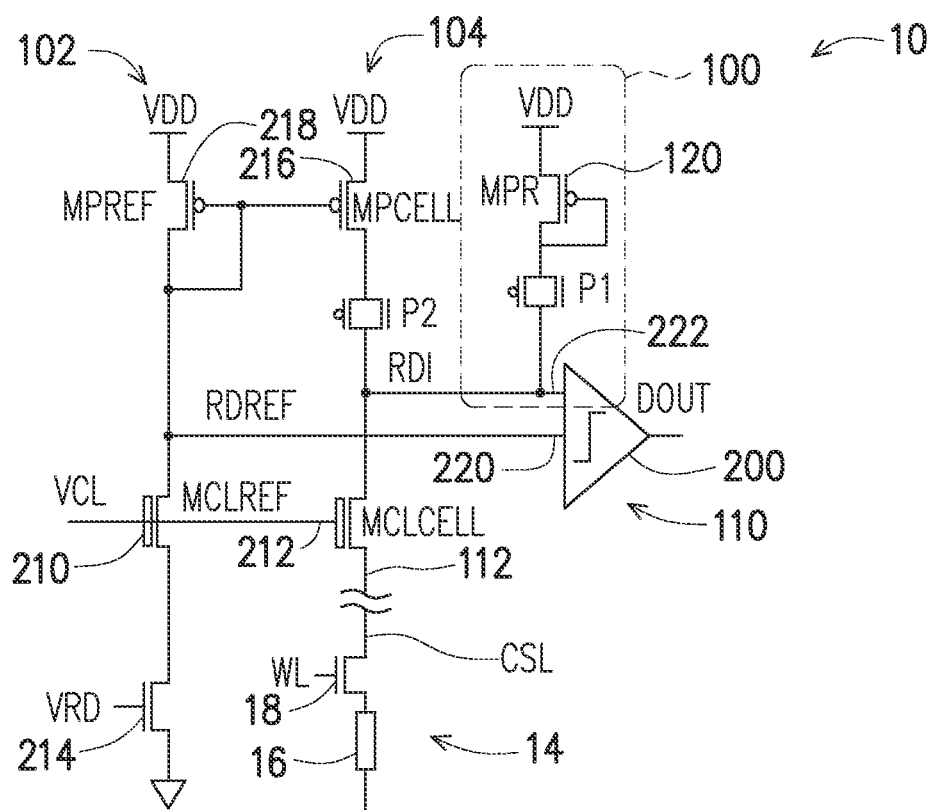
FIG. 3 is a circuit diagram depicting further aspects of an example of a precharger for the RRAM device shown in FIG. 2 in accordance with some embodiments.

FIG. 3 depicts an example of the read sense amplifier 110 of the RRAM device 10, illustrating further aspects of the precharger 100. The precharger 100 includes a single-ended current with a first switch P1 operable to selectively connect the sensing circuit 104 and the second input 222 of the comparator 200 to a predetermined precharge voltage. A second switch P2 is connected between the VDD terminal and the sense amplifier input 112, which is further connected to the sense amplifier input terminal 112. Thus, the first and second switches P1, P2 are operable to precharge the source line CSL to a predetermined precharge voltage, or to connect the sensing circuit 104 to the VDD terminal and mirror the reference current in the reference circuit 102 via the mirror transistors 216, 218 and develop a voltage in the sensing circuit 104 based on the resistive value of the RRAM resistor 16.

The illustrated precharger 100 includes a precharge diode 120 connected between the VDD terminal and the first switch P1. In the illustrated example, the precharge diode 120 is a diode-connected PMOS transistor. Accordingly, the first switch P1 selectively connects the sense amplifier input terminal 112 to the precharge diode 120, while the second switch P2 selectively connects the sense amplifier input terminal 112 to the VDD terminal via the mirror transistor 216 of the sensing circuit 104.

Figure 4A:
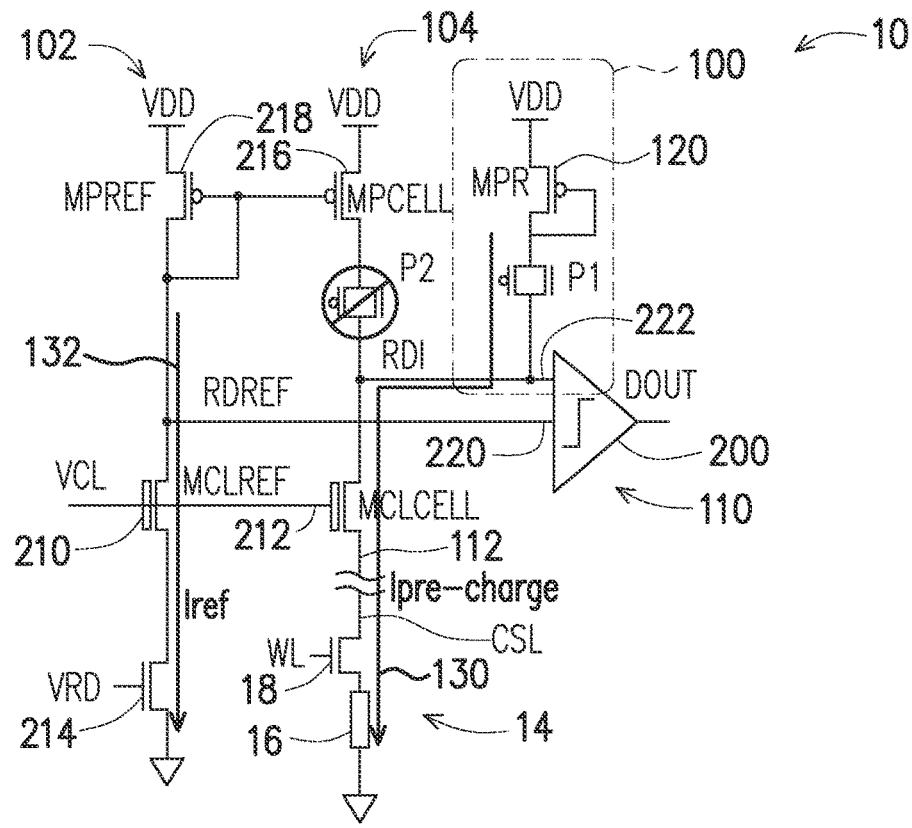
FIGS. 4A and 4B illustrate an example of precharge and read operations, respectively, for the RRAM device of FIG. 3.

FIG. 4A conceptually illustrates an example of the sense amplifier 110 in a first, or precharge phase, in which the first switch P1 is activated and the second switch P2 is deactivated to pre-charge the sensing circuit 104 to a predetermined precharge voltage level. Thus, the sense amplifier input terminal 112 is disconnected from the VDD voltage terminal, and the sense amplifier input terminal 112 is connected to the predetermined precharge voltage at the output of the precharge diode 120 as indicated by the precharge current path Ipre-charge 130 that extends from the precharge diode 120 to the RRAM cell 14 via the common source line CSL. A reference current path Iref 132 extends from the mirror transistor 218 to the ground terminal.

In the illustrated example, the precharge voltage level is determined according to

VDD-VTH1 where VDD is the source voltage received at the VDD terminal, and where VTH1 is the threshold voltage of the precharge diode 120 (formed by the diode-connected PMOS transistor). As noted above, the precharger 100 includes the precharge diode 120 connected to the VDD voltage terminal. The reference circuit 102 similarly includes the mirror transistor 218, which is also diode-connected, coupled to the VDD terminal. As such, the reference voltage level is determined according to

VDD-VTH2 where VDD is the source voltage received at the VDD terminal, and where VTH2 is the threshold voltage of the diode-connected mirror transistor 218. The structure of the diode-connected mirror transistor 218 is similar to the diode-connected PMOS transistor forming the precharge diode 120. As such, the threshold voltages of the diode-connected mirror transistor 218 and the diode-connected PMOS transistor forming the precharge diode 120 are approximately equal. Thus, the precharge voltage is approximately equal to the reference voltage. As a result, the precharger 100 precharges the second input 222 of the comparator 200 to approximately the same voltage level as the reference voltage received at the first input 220 of the comparator 200.

Figure 4B:
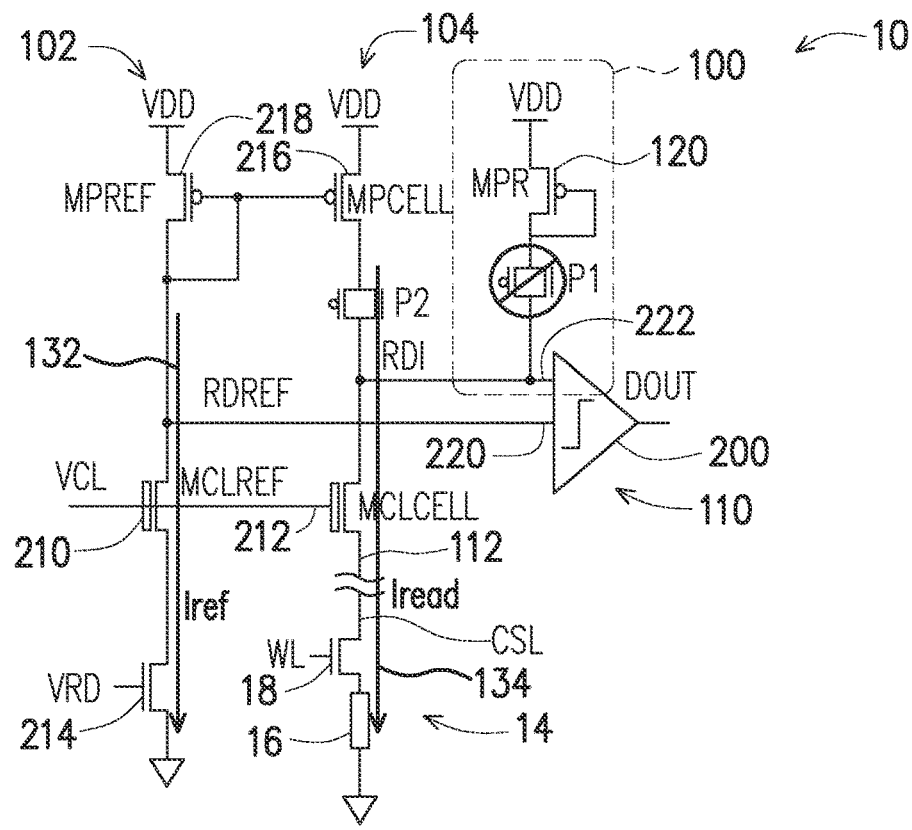

FIG. 4B illustrates a second, or signal developing phase, where the P1 switch is deactivated to cut off pre-charge path 130. Meanwhile, the second switch P2 is activated to establish a data read path Iread 134. This results in the sensing circuit 104 mirroring the reference current developed by the reference path Iref and developing a voltage difference in the sensing circuit 104. The voltage signal RDI developed by the sensing circuit 104 is received at the second input 222 of the comparator 200, and the reference voltage signal RDREF is received at the first input 220 of the comparator 200. The comparator 200 can then detect a voltage difference between RDI and RDREF and latch the appropriate result at the output terminal DOUT.

The illustrated example of the sense amplifier 110 further includes PMOS transistors MCLREF 210 and MCLCELL 212 in the reference circuit 102 and sensing circuit 104, respectively. Both the MCLREF transistor 210 and the MCLCELL transistor 212 have their respective gate terminals connected to receive a VCL control signal to selectively connect the sense amplifier 110 to the input terminal 112, and thus the source line CSL of the RRAM cell 14. As noted above, the word line signal WL selects the appropriate memory cells 14 based on the received word line address.

Figure 5:
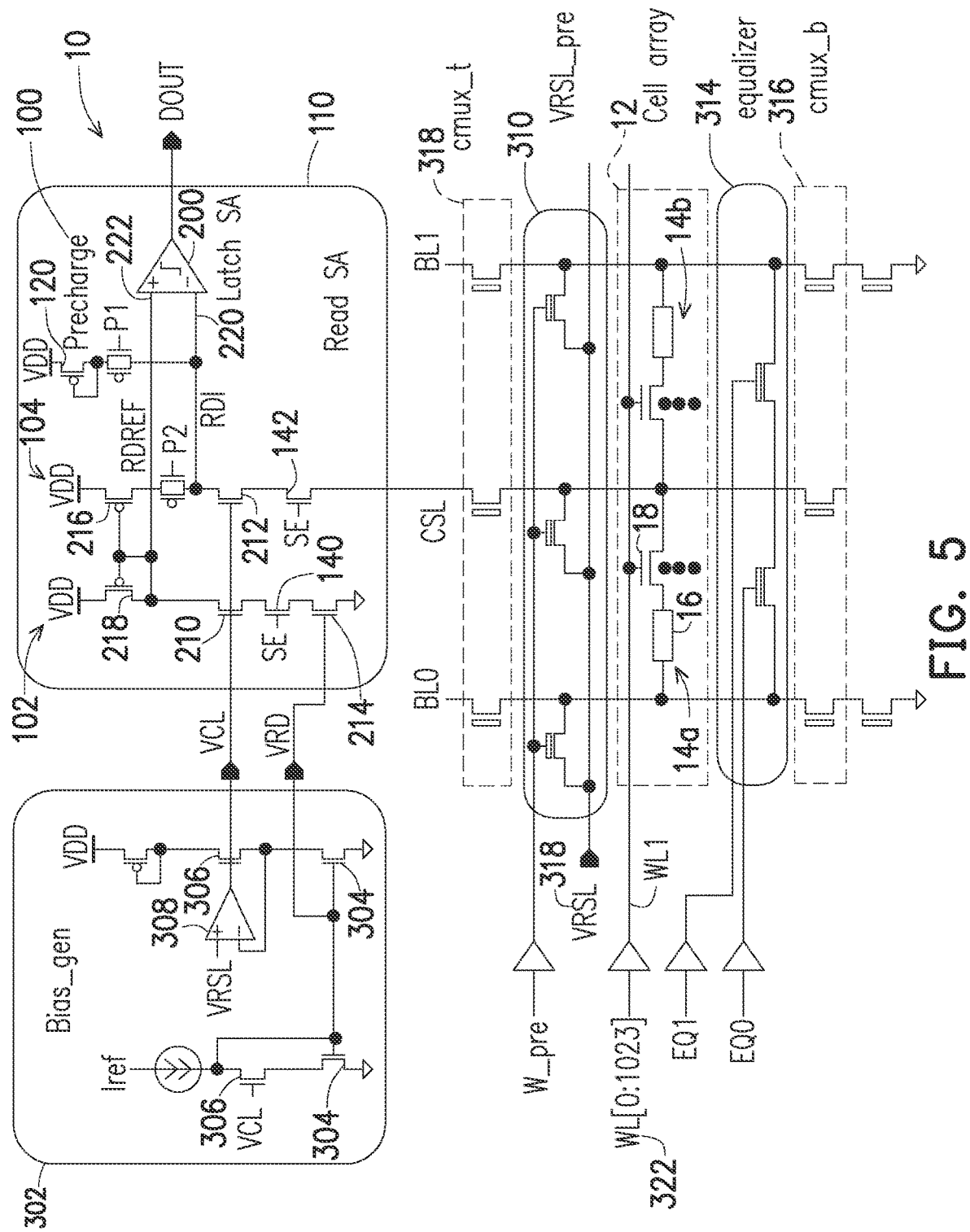
FIG. 5 is a circuit diagram depicting further aspects of the RRAM device shown in FIG. 1 in accordance with some embodiments.

FIG. 5 is a schematic diagram illustrating further aspects of an example of the RRAM device 10. The example shown in FIG. 5 includes the sense amplifier 110 illustrated in FIG. 3 discussed above. Control transistors 140, 142 receive a sense amplifier enable signal SE that enables the sense amplifier 110 for read operations. A bias generator 302 provides control signals VCL and VRD to control the operation of the sense amplifier reference circuit 106 and sensing circuit 104. The bias generator 302 provides a stable read reference current Iref and read reference voltage bias signal VRSL for read operations. The reference current Iref is connected to one terminal of a clamping transistor 306, and is mirrored to the sense amplifier 110 by a VRD bias signal, which is connected to the gate nodes of current mirror transistors 304. The read voltage signal VRSL is received at an input of a comparator 308, and may be passed to the sense amplifier 110 by the VCL bias signal, which is connected to the gate nodes of clamping transistors 306.

The sense amplifier 110 is also coupled to a common source line CSL of the RRAM memory cells 14a, 14b of the RRAM array 12. The bit lines BL0, BL1 are configured to connect the memory cells 14a, 14b to the sensing circuit 104 of the sense amplifier 110 via the respective access transistors 18. The word line WL1 is connected to the access transistors 18 and is configured to supply a word line signal 322 to control the operation of the cell array transistors 18 based on the received word line address.

An equalizer 314 is configured to equalize the voltage between the bit lines BL0, BL1, and a multiplexer 316, 318 receives bit line control signals based on the bit line address to select the desired bit line(s) BL0, BL1 for memory operations.

In the illustrated example, a second, or bit line/source line precharger 310 selectively provides a precharge voltage VRSL to the bit lines BL0, BL1 and the common source line CSL in response to a precharge control signal W_pre, which is a complement of the word line signal WL (i.e. the W_pre signal is a logic low when the word line signal WL is a logic high, and vice versa). This results in a substantially static and bias voltage being applied to the common source line CSL.

Figure 6:
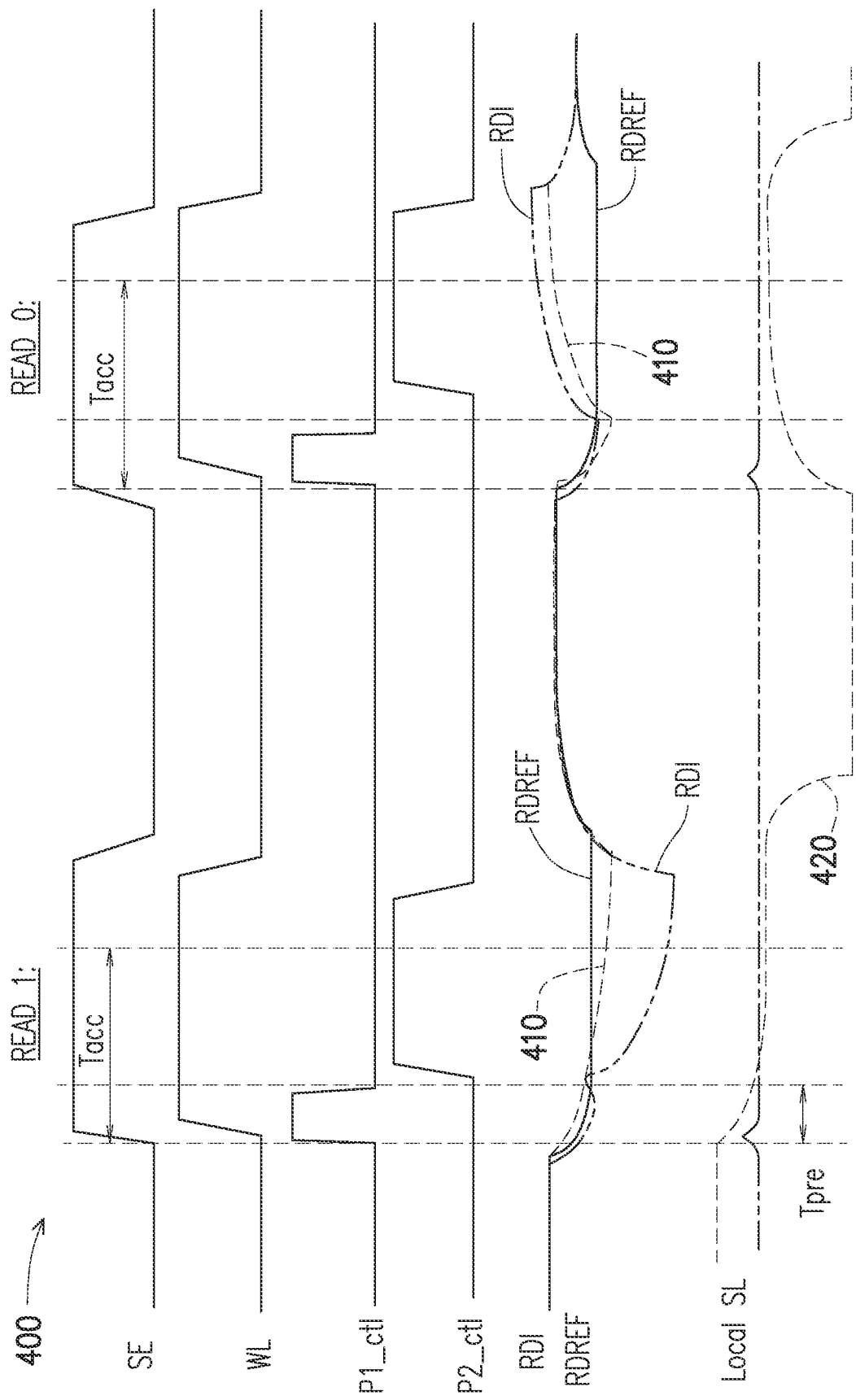
FIG. 6 is a timing diagram depicting example signals of an RRAM circuit in accordance with some embodiments.

FIG. 6 shows a chart 400 depicting example wave forms of the RRAM device 10 for read 1 and read 0 operations. The chart 400 further compares certain signals for the disclosed RRAM device 10 including the precharger 100 to signals for an RRAM that does not have the precharger disclosed herein. At the start of a read operation, the sense amplifier enable signal SE, the word line signal WL and the first phase precharge signal P1 go high. The high sense amplifier enable signal SE enables the control transistors 140, 142 and the sense amplifier 110 is connected to the cell array 12. During the precharge phase where the first precharge control signal P1_ctl is high, the switch P1 is closed to establish the precharge path through the first switch P1 (see FIG. 4A). This precharges the RDI signal to a predetermined precharge voltage level, which is close to the read voltage level. As noted above, in some examples the precharge voltage level is VDD less the threshold voltage of the precharge diode 120 (VDD-VTH1). The word line WL signal activates the appropriate access transistors 18 in the memory cell array 12, connecting desired memory cells 14a, 14b to the selected bit line BL0, BL1 and the common source line CSL.

Thus, during the precharge phase Tpre, the RDI signal is precharged to the precharge voltage level. At the end of the precharge phase Tpre, the switch P1 is deactivated (precharge control signal P1_ctl goes low). The second switch P2 is then activated for the sensing phase, with the second switch control signal P2_ctl signal going high. This connects the sensing circuit 104 to the VDD voltage and establishes the Iread current path 134 shown in FIG. 4B, which results in developing the RDI signal to establish a voltage difference in the sensing circuit 104. Due to the precharging phase, the RDI signal quickly transitions, allowing the comparator 200 to latch the output DOUT faster as shown by the shorter access time Tacc. The broken line 410 illustrates an example of a comparative RDI signal 410 generated by an RRAM device that does not include the precharger 100 disclosed herein. As shown in FIG. 6, the comparative RDI signal 410 transitions slower, increasing the access time Tacc for latching the output signal DOUT.

The local source line signal SL remains stable and nearly constant due to the application of the VRSL signal in response to the W-pre signal as shown in FIG. 5. This reduces the settling time compared to a comparative local source line signal SL illustrated by the broken line 420, which makes nearly a complete transition between logic low and high levels for each read cycle, resulting in increased time required to develop the output signal DOUT. Once the DOUT signal has been latched, the signals P2_ctl, WL and SE 402 will go low and the process will be reset for the next read cycle.

Figure 7:
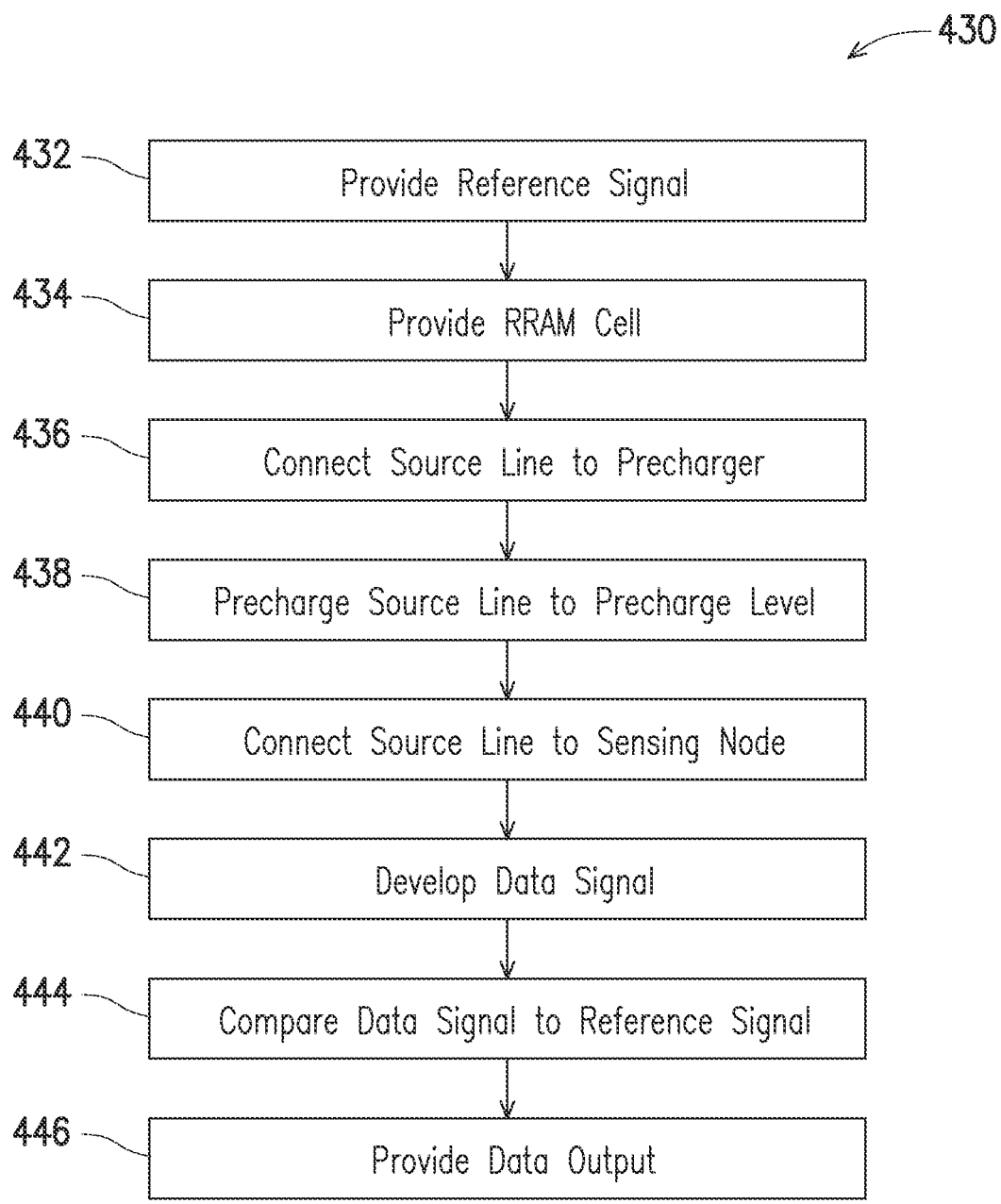
FIG. 7 is a process flow diagram depicting an example of an RRAM read method in accordance with some embodiments.

FIG. 7 illustrates a data read process 430 for a RRAM device. At operation 432 a reference voltage signal RDREF is provided. A RRAM cell 14 is provided at operation 434. As noted previously, the RRAM cell has a common source line CSL connected to the resistive memory cell 14, as well as bit lines BL0, BL1 and word lines WL1, WL2. At operation 436, the source line CSL is connected to a precharger 100 to precharge the source line CSL to a predetermined precharge voltage level as shown in operation 438. In some examples, the precharge level is approximately equal to the reference voltage RDREF. After precharging the source line CSL, the source line is connected to a sensing circuit 104 to develop a data voltage signal RDI from the resistive memory cell 14, as indicated in operations 440, 442.

The data voltage signal RDI is compared to the reference voltage signal RDREF, for example, by the comparator 200 at operation 444. The comparator latches the output, and at operation 446 a data output DOUT is provided based on the comparison of the RDI and RDREFF signals.

Accordingly, the various embodiments disclosed herein provide an RRAM precharge device and method that can achieve faster memory read access times by overcoming RC delay. The precharging happens in 2 stages. First the bit lines are precharged to a value approximately the read voltage. Then the read SA circuit is precharge to the final precharge value. The RRAM is then read and its value is compared to a reference value and DOUT is produced.

The precharging is accomplished by the use of two switches, one in the precharger and the other in the sensing circuit. During the first phase the first switch is closed and the precharging begins. In the second stage the first switch opens and the second switch closes, and the voltage difference is developed. DOUT is then output.

Disclosed embodiments thus provide a sense amplifier arrangement that facilitates a faster RRAM data signal transition, and also provides a bigger data signal difference as compared to the reference signal provided to the sense amplifier comparator. This in turn results in decreased memory cell access time, and a faster data output. In accordance with some disclosed examples, a memory device, such as a resistive memory device, includes a resistive memory cell and a sense amplifier. The sense amplifier has a reference circuit configured to output a reference voltage and a sensing circuit connected to the resistive memory cell. A comparator includes a first input and a second input, with the first input connected to the reference circuit to receive the reference voltage, and the second input connected to the resistive memory cell. A precharger is configured to selectively precharge the sensing circuit to a predetermined precharge voltage.

In accordance with further disclosed embodiments, a sense amplifier for a memory is provided with a sense amplifier input terminal. A comparator has a first input and a second input. The first input is configured to receive a reference voltage, and the second input is coupled to the sense amplifier input and configured to receive a data signal from a memory cell, which may be a resistive memory cell in some examples. A precharge diode is connected to a source voltage terminal. A first switch is coupled between the precharge diode and the second input of the comparator, and a second switch is coupled between the source voltage terminal and the sense amplifier input terminal. The first and second switches are configured to selectively precharge the sense amplifier input to a predetermined precharge voltage.

In accordance with other disclosed examples, a memory read method includes providing a reference voltage signal and a memory cell having a source line connected to the resistive memory cell. The memory cell may be a resistive memory cell in some examples. The source line is connected to a precharger to precharge the source line to a predetermined precharge voltage level. After precharging the source line, the source line is connected to a sensing circuit to develop a data voltage signal from the resistive memory cell. The data voltage signal is compared to the reference voltage signal, and a data output is provided based on the comparison.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
 a memory cell;
 a source line;
 a reference circuit configured to output a reference voltage;
 a sensing circuit connectable to the memory cell via the source line, the reference circuit configured to generate a cell voltage of the memory cell;
 a comparator having a first input and a second input, the first input connected to the reference circuit to receive the reference voltage, the second input connected to the source line; and
 a precharger configured to selectively precharge the source line to a predetermined precharge voltage; and
 switch control configured to, after precharging the source line, disconnect the precharger from the source line and connect the sensing circuit to the source line to enable the sensing circuit to develop the cell voltage;
 wherein the switch control includes a first switch configured to selectively connect the sensing circuit to the predetermined precharge voltage, and a second switch configured to selectively connect the sensing circuit to a source voltage terminal configured to receive a source voltage, wherein the predetermined precharge voltage is lower than the source voltage; and wherein the precharger includes a precharge diode connected between the source voltage terminal and the first switch.

2. The memory device of claim 1, further comprising:
a bit line connected to the memory cell;
wherein the memory cell includes a resistive element having a first terminal connected to the bit line.

3. The memory device of claim 2, further comprising:
a control transistor connected between a second terminal of the resistive element and the source line, wherein a word line is connected to a gate terminal of the control transistor to electrically connect the resistive element between the bit line and the source line.

4. The memory device of claim 1, further comprising:
a bias generator configured to output control signals to the reference circuit and the sensing circuit.

5. The memory device of claim 1, wherein:
the precharge diode comprises a diode-connected PMOS transistor.

6. The memory device of claim 5, wherein:
the reference circuit includes a first mirror transistor connected between the source voltage terminal and the first input of the comparator, the first mirror transistor being diode-connected; and
the sensing circuit includes a second mirror transistor connected between the source voltage terminal and the second terminal of the comparator, the second mirror transistor having a gate terminal connected to a gate terminal of the first mirror transistor.

7. The memory device of claim 1, wherein:
the precharge voltage is approximately equal to the reference voltage.

8. The memory device of claim 1, further comprising:
a source line precharger configured to selectively precharge the source line to a read precharge voltage.

9. A sense amplifier for a memory device, comprising:
a sense amplifier input terminal;
a comparator having a first input to receive a reference voltage and a second input to receive a data signal from a memory cell;
a precharge circuit connected to a source voltage terminal;
a first switch coupled between the precharge circuit and the second input of the comparator; and
a second switch coupled between the source voltage terminal and the sense amplifier input terminal;
wherein the first switch and the second switch are configured to selectively precharge the sense amplifier input terminal to a predetermined precharge voltage.

10. The sense amplifier of claim 9, wherein:
the precharge circuit includes a diode-connected PMOS transistor connected between the source voltage terminal and the first input of the comparator.

11. The sense amplifier of claim 9, wherein:
the first switch and the second switch are configured to selectively connect a source line to the precharge circuit and disconnect a sensing circuit from the source line to precharge the source line to the predetermined precharge voltage.

12. The sense amplifier of claim 11, wherein:
the sensing circuit is configured to sense a data signal received from the memory cell, the sensing circuit including a first mirror transistor connected between the source voltage terminal and the second input of the comparator, the second mirror transistor having a gate terminal connected to a gate terminal of the first mirror transistor.

13. The sense amplifier of claim 12, wherein:
the reference circuit includes a second mirror transistor connected between the source voltage terminal and the first input of the comparator.

14. The sense amplifier of claim 9, wherein:
the precharger includes a precharge diode that is connected to the source voltage terminal;
the source voltage terminal is configured to receive a first voltage VDD; and
the precharge voltage is determined according to
VDD-VTH
where VTH is a threshold voltage of the precharge diode.

15. The sense amplifier of claim 9, wherein:
the reference voltage is determined according to
VDD-VTH2
where VTH2 is a threshold voltage of the second mirror transistor, and wherein VTH is approximately equal to VTH2.

16. A method, comprising:
precharging, with a precharger circuit, a source line to predetermined precharge voltage level, including controlling a first switch to selectively connect the source line to a precharge diode connected to a source voltage terminal configured to receive a source voltage such that the predetermined precharge voltage is lower than the source voltage;
disconnecting the precharger circuit from the source line;
connecting a sensing circuit to the source line to enable a reference circuit to develop a cell voltage, including controlling a second switch to selectively connect the sensing circuit to the source voltage terminal;
comparing the cell voltage to a reference voltage; and
providing a data output based on the comparison.

17. The method of claim 16, wherein disconnecting the precharger circuit from the source line includes disconnecting the source line from the source voltage terminal.

18. The method of claim 16, further comprising:
after precharging the source line, applying a read current signal to the source line to develop the cell voltage.

19. The method of claim 16, further comprising generating control signals for the.

20. The method of claim 16, the precharge voltage is approximately equal to the reference voltage.

* * * * *